US008963267B2

(12) United States Patent
Kokubun et al.

(10) Patent No.: US 8,963,267 B2
(45) Date of Patent: Feb. 24, 2015

(54) SOLID-STATE IMAGING DEVICE AND MANUFACTURING METHOD OF SOLID-STATE IMAGING DEVICE

(75) Inventors: Koichi Kokubun, Kanagawa (JP); Yusaku Konno, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 13/601,165

(22) Filed: Aug. 31, 2012

(65) Prior Publication Data
US 2013/0093034 A1 Apr. 18, 2013

(30) Foreign Application Priority Data
Oct. 17, 2011 (JP) ................................ 2011-227773

(51) Int. Cl.
*H01L 31/0232* (2014.01)
*H01L 31/18* (2006.01)
*H01L 31/0216* (2014.01)
*H01L 27/146* (2006.01)

(52) U.S. Cl.
CPC .... *H01L 31/02165* (2013.01); *H01L 27/14621* (2013.01); *H01L 27/14629* (2013.01); *H01L 27/14685* (2013.01)
USPC .......................................... 257/432; 257/294

(58) Field of Classification Search
USPC .................. 257/290–294, 431–448, E31.127
See application file for complete search history.

(56) References Cited

U.S. PATENT DOCUMENTS

| 8,530,814 B2* | 9/2013 | Wano et al. .................... 257/432 |
| 2010/0244168 A1 | 9/2010 | Shiozawa et al. |
| 2012/0086093 A1* | 4/2012 | Otsuka et al. ................. 257/432 |
| 2014/0117482 A1* | 5/2014 | Noda et al. .................... 257/432 |

FOREIGN PATENT DOCUMENTS

| JP | 2006-350126 A | 12/2006 |
| JP | 2008-170979 A | 7/2008 |
| JP | 2010-067829 A | 3/2010 |
| JP | 2010-225944 A | 10/2010 |
| JP | 2010-232537 A | 10/2010 |

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

According to one embodiment, there is provided a solid-state imaging device including a first photoelectric conversion layer and a color filter. The color filter includes a multi-layer interference filter and a guided mode resonant grating. The guided mode resonant grating includes a plurality of diffraction gratings and a plurality of inter-grating regions. The plurality of diffraction gratings are formed of a material having a first index of refraction and periodically arrayed at least one-dimensionally. The plurality of inter-grating regions are arranged between at least the plurality of diffraction gratings. Each of the plurality of inter-grating regions includes an insulating film region and an air gap region. The insulating film region is formed of a material having a second index of refraction lower than the first index of refraction.

18 Claims, 10 Drawing Sheets

SOLID-STATE IMAGING DEVICE AND MANUFACTURING METHOD OF SOLID-STATE IMAGING DEVICE

CROSS-REFERENCE TO RELATED APPLICATIONS

This application is based upon and claims the benefit of priority from Japanese Patent Application No. 2011-227773, filed on Oct. 17, 2011; the entire contents of which are incorporated herein by reference.

FIELD

Embodiments described herein relate generally to a solid-state imaging device and a manufacturing method of the solid-state imaging device.

BACKGROUND

A color filter currently used in an image sensor is often configured by an organic pigment. However, it can be assumed that miniaturization and thinning (contribution to lower height) are difficult in terms of processing with the filter of organic pigment with respect to the technical tendency of miniaturization of pixels (increase in number of pixels) and lower height as represented by back surface irradiation type. Development of a color filter with a new structure that takes place of the organic pigment filter is thus desired. Furthermore, improvement in crosstalk (mixed color) is desired in the color filter with a new structure.

DETAILED DESCRIPTION

In general, according to one embodiment, there is provided a solid-state imaging device including a first photoelectric conversion layer and a color filter. The color filter is arranged above the first photoelectric conversion layer. The color filter includes a multi-layer interference filter and a guided mode resonant grating. In the multi-layer interference filter, a first layer and a second layer having different index of refraction from each other are alternately stacked. The guided mode resonant grating is arranged above or below the multi-layer interference filter. The guided mode resonant grating includes a plurality of diffraction gratings and a plurality of inter-grating regions. The plurality of diffraction gratings are formed of a material having a first index of refraction and periodically arrayed at least one-dimensionally. The plurality of inter-grating regions are arranged between at least the plurality of diffraction gratings. Each of the plurality of inter-grating regions includes an insulating film region and an air gap region. The insulating film region is formed of a material having a second index of refraction lower than the first index of refraction.

Exemplary embodiments of a solid-state imaging device and a manufacturing method of the solid-state imaging device will be explained below in detail with reference to the accompanying drawings. The present invention is not limited to the following embodiments.

Embodiment

Figure 1:
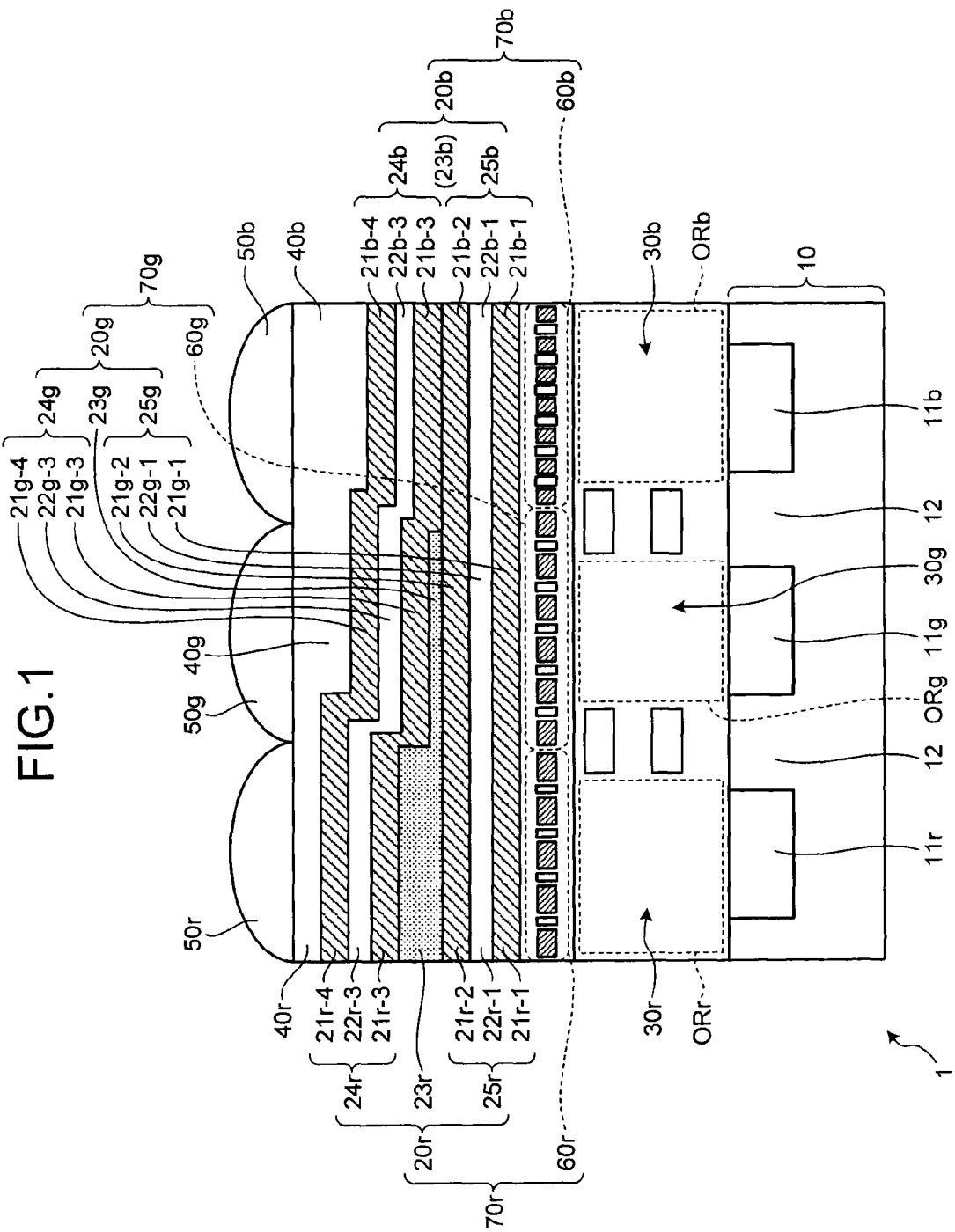
FIG. 1 is a view illustrating a configuration of a solid-state imaging device according to an embodiment.

A solid-state imaging device 1 according to the embodiment will be described using FIG. 1. FIG. 1 is a view illustratively illustrating a cross-sectional configuration for three pixels in the solid-state imaging device 1 according to the embodiment.

The solid-state imaging device 1 includes photoelectric conversion layers 11r, 11g, 11b, multi-layer wiring structures 30r, 30g, 30b, color filters 70r, 70g, 70b, planarizing layers 40r, 40g, 40b, and microlenses 50r, 50g, 50b.

The photoelectric conversion layers 11r, 11g, 11b are arranged in a well region 12 in a semiconductor substrate 10. The photoelectric conversion layers 11r, 11g, 11b respectively receive light of a wavelength region of red (R), green (G), and blue (B). Each photoelectric conversion layer 11r, 11g, 11b generates charges according to the received light, and accumulates the charges. The photoelectric conversion layers 11r, 11g, 11b are, for example, photodiodes, and include a charge accumulating region.

The well region 12 is formed from a semiconductor (e.g., silicon) containing impurities of first conductivity type (e.g., P type) at a low concentration. The P type impurities are, for example, boron. Each charge accumulating region in the photoelectric conversion layers 11r, 11g, 11b is formed from a semiconductor (e.g., silicon) containing impurities of second conductivity type (e.g., N type), which is an opposite conductivity type of the first conductivity type, at a concentration higher than the concentration of the impurities of the first conductivity type in the well region 12. The N type impurities are, for example, phosphorous or arsenic.

The multi-layer wiring structures 30r, 30g, 30b are arranged on the semiconductor substrate 10. The multi-layer wiring structures 30r, 30g, 30b have a wiring pattern of a plurality of layers extended through the inter-layer insulating film. The multi-layer wiring structures 30r, 30g, 30b thus respectively define opening regions ORr, ORg, ORb corresponding to the photoelectric conversion layers 11r, 11g, 11b. The inter-layer insulating film is, for example, made of silicon oxide. The wiring pattern is, for example, made of metal.

The color filter 70r is arranged above the photoelectric conversion layer 11r. The color filter 70r thus selectively guides the light in the wavelength region of red (R) of the incident light to the photoelectric conversion layer 11r.

Figure 2A:
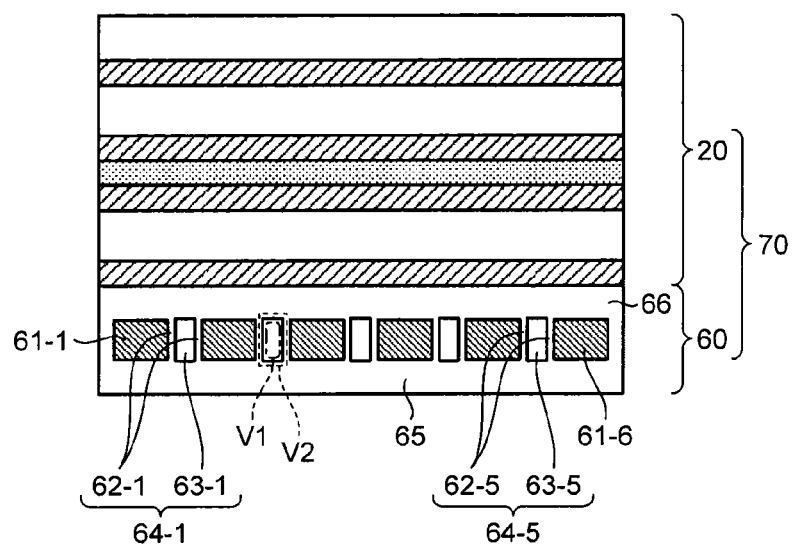
FIG. 2A and FIG. 2B are views illustrating a configuration and properties of a color filter according to the embodiment.

Specifically, the color filter 70r includes a multi-layer interference filter 20r and a guided mode resonant grating 60r (see FIG. 2A). The multi-layer interference filter 20r and the guided mode resonant grating 60r both have filter properties, but the multi-layer interference filter 20r mainly functions to selectively transmit the light in the wavelength region of red (R) of the incident light, whereas the guided mode resonant grating 60r mainly functions to selectively reflect and remove the mixed color component (light in the wavelength region other than red (R)) of the incident light. The multi-layer interference filter 20r and the guided mode resonant grating 60r are both made of inorganic material.

The multi-layer interference filter 20r is, for example, a photonic crystal type red filter in which inorganic materials (material of low index of refraction and material of high index of refraction) are stacked. The multi-layer interference filter 20r includes an upper stacked structure 24r, an interference layer 23r, and a lower stacked structure 25r. The upper stacked structure 24r and the lower stacked structure 25r respectively function as an opposing mirror of a reflection surface. In this case, the upper stacked structure 24r and the lower stacked structure 25r have a wavelength (e.g., 550 nm) at a central part of a visible region (e.g., wavelength region of 400 nm to 700 nm) as a center wavelength (i.e., wavelength where reflectivity of the mirror becomes a peak). The interference layer 23r is arranged at an interface of the upper stacked structure 24r and the lower stacked structure 25r, and enables interference (multi-beam interference) of the light multiply reflected at the reflection surfaces of the upper stacked structure 24r and the lower stacked structure 25r. In other words, the multi-layer interference filter 20r functions based on the same principle as a Fabry-Perot interferometer.

In the upper stacked structure 24r, first layers 21r-3, 21r-4 and a second layer 22r-3 having different index of refraction from each other are alternately stacked. In the upper stacked structure 24r, for example, the first layer 21r-3, the second layer 22r-3, and the first layer 21r-4 are stacked in such order.

In the lower stacked structure 25r, first layers 21r-1, 21r-2 and a second layer 22r-1 having different index of refraction from each other are alternately stacked. In the upper stacked structure 24r, for example, the first layer 21r-1, the second layer 22r-1, and the first layer 21r-2 are stacked in such order.

The index of refraction of the first layers 21r-1, 21r-2, 21r-3, 21r-4 is, for example, higher than the index of refraction of the second layers 22r-1, 22r-3. The first layers 21r-1, 21r-2, 21r-3, 21r-4 are, for example, made of titanium oxide ($TiO_2$, index of refraction 2.5). The second layers 22r-1, 22r-3 are, for example, made of silicon oxide ($SiO_2$, index of refraction 1.45).

The index of refraction of the interference layer 23r is lower than the index of refraction of the first layers 21r-1, 21r-2, 21r-3, 21r-4. The interference layer 23r is made of, for example, silicon oxide ($SiO_2$, index of refraction 1.45).

The guided mode resonant grating 60r is, for example, a red filter using a guided mode resonant phenomenon in which inorganic materials (material of low index of refraction and material of high index of refraction) are at least one-dimensionally arrayed. The guided mode resonant grating 60r is arranged below the multi-layer interference filter 20r. Accordingly, the guided mode resonant grating 60r receives the light transmitted through the multi-layer interference filter 20r, selectively reflects and removes the mixed color component (light in the wavelength region other than red (R)) of the received light and selectively transmits the light in the wavelength region of red (R). The specific configuration of the guided mode resonant grating 60r will be hereinafter described.

The color filter 70g is arranged above the photoelectric conversion layer 11g. The color filter 70g thus selectively guides the light in the wavelength region of green (G) of the incident light to the photoelectric conversion layer 11g.

Specifically, the color filter 70g includes a multi-layer interference filter 20g and a guided mode resonant grating 60g (see FIG. 2A). The multi-layer interference filter 20g and the guided mode resonant grating 60g both have filter properties, but the multi-layer interference filter 20g mainly functions to selectively transmit the light in the wavelength region of green (G) of the incident light, whereas the guided mode resonant grating 60g mainly functions to selectively reflect and remove the mixed color component (light in the wavelength region other than the green (G)) of the incident light. The multi-layer interference filter 20g and the guided mode resonant grating 60g are both made of inorganic material.

The multi-layer interference filter 20g is, for example, a photonic crystal type green filter in which inorganic materials (material of low index of refraction and material of high index of refraction) are stacked. The multi-layer interference filter 20g includes an upper stacked structure 24g, an interference layer 23g, and a lower stacked structure 25g. The upper stacked structure 24g and the lower stacked structure 25g respectively function as an opposing mirror of a reflection surface. In this case, the upper stacked structure 24g and the lower stacked structure 25g have a wavelength (e.g., 550 nm) at a central part of a visible region (e.g., wavelength region of 400 nm to 700 nm) as a center wavelength (i.e., wavelength where reflectivity of the mirror becomes a peak). The interference layer 23g is arranged at an interface of the upper stacked structure 24g and the lower stacked structure 25g, and enables interference (multi-beam interference) of the light multiply reflected at the reflection surfaces of the upper stacked structure 24g and the lower stacked structure 25g. In other words, the multi-layer interference filter 20g functions based on the same principle as a Fabry-Perot interferometer.

In the upper stacked structure 24g, first layers 21g-3, 21g-4 and a second layer 22g-3 having different index of refraction from each other are alternately stacked. In the upper stacked structure 24g, for example, the first layer 21g-3, the second layer 22g-3, and the first layer 21g-4 are stacked in such order.

In the lower stacked structure 25g, first layers 21g-1, 21g-2 and a second layer 22g-1 having different index of refraction from each other are alternately stacked. In the upper stacked structure 24g, for example, the first layer 21g-1, the second layer 22g-1, and the first layer 21g-2 are stacked in such order.

The index of refraction of the first layers 21g-1, 21g-2, 21g-3, 21g-4 is, for example, higher than the index of refraction of the second layers 22g-1, 22g-3. The first layers 21g-1, 21g-2, 21g-3, 21g-4 are, for example, made of titanium oxide ($TiO_2$, index of refraction 2.5). The second layers 22g-1, 22g-3 are, for example, made of silicon oxide ($SiO_2$, index of refraction 1.45).

The index of refraction of the interference layer 23g is lower than the index of refraction of the first layers 21g-1, 21g-2, 21g-3, 21g-4. The interference layer 23g is made of, for example, silicon oxide ($SiO_2$, index of refraction 1.45).

The guided mode resonant grating 60g is, for example, a green filter using a guided mode resonant phenomenon in which inorganic materials (material of low index of refraction and material of high index of refraction) are at least one-dimensionally arrayed. The guided mode resonant grating 60g is arranged below the multi-layer interference filter 20g. Accordingly, the guided mode resonant grating 60g receives the light transmitted through the multi-layer interference filter 20g, selectively reflects and removes the mixed color component (light in the wavelength region other than green (G)) of the received light and selectively transmits the light in the wavelength region of green (G). The specific configuration of the guided mode resonant grating 60g will be hereinafter described.

The color filter 70b is arranged above the photoelectric conversion layer 11b. The color filter 70b thus selectively guides the light in the wavelength region of blue (B) of the incident light to the photoelectric conversion layer 11b.

Specifically, the color filter 70b includes a multi-layer interference filter 20b and a guided mode resonant grating 60b (see FIG. 2A). The multi-layer interference filter 20b and the guided mode resonant grating 60b both have filter properties, but the multi-layer interference filter 20b mainly functions to selectively transmit the light in the wavelength region of blue (B) of the incident light, whereas the guided mode resonant grating 60b mainly functions to selectively reflect and remove the mixed color component (light in the wavelength region other than the blue (B)) of the incident light. The multi-layer interference filter 20b and the guided mode resonant grating 60b are both made of inorganic material.

The multi-layer interference filter 20b is, for example, a photonic crystal type blue filter in which inorganic materials (material of low index of refraction and material of high index of refraction) are stacked. The multi-layer interference filter 20b includes an upper stacked structure 24b, an interference layer 23b, and a lower stacked structure 25b. In other words, in the multi-layer interference filter 20b, the interference layer 23b having a film thickness of 0 nm is assumed to be virtually arranged between the upper stacked structure 24b and the lower stacked structure 25b. The upper stacked structure 24b and the lower stacked structure 25b respectively function as an opposing mirror of a reflection surface. In this case, the upper stacked structure 24b and the lower stacked structure 25b have a wavelength (e.g., 550 nm) at a central part of a visible region (e.g., wavelength region of 400 nm to 700 nm) as a center wavelength (i.e., wavelength where reflectivity of the mirror becomes a peak). The interference layer 23b is (virtually) arranged at an interface of the upper stacked structure 24b and the lower stacked structure 25b, and enables interference (multi-beam interference) of the light multiply reflected at the reflection surfaces of the upper stacked structure 24b and the lower stacked structure 25b. In other words, the multi-layer interference filter 20b functions based on the same principle as a Fabry-Perot interferometer.

In the upper stacked structure 24b, first layers 21b-3, 21b-4 and a second layer 22b-3 having different index of refraction from each other are alternately stacked. In the upper stacked structure 24b, for example, the first layer 21b-3, the second layer 22b-3, and the first layer 21b-4 are stacked in such order.

In the lower stacked structure 25b, first layers 21b-1, 21b-2 and a second layer 22b-1 having different index of refraction from each other are alternately stacked. In the upper stacked structure 24b, for example, the first layer 21b-1, the second layer 22b-1, and the first layer 21b-2 are stacked in such order.

The index of refraction of the first layers 21b-1, 21b-2, 21b-3, 21b-4 is, for example, higher than the index of refraction of the second layers 22b-1, 22b-3. The first layers 21b-1, 21b-2, 21b-3, 21b-4 are, for example, made of titanium oxide ($TiO_2$, index of refraction 2.5). The second layers 22b-1, 22b-3 are, for example, made of silicon oxide ($SiO_2$, index of refraction 1.45).

The index of refraction of the interference layer 23b is lower than the index of refraction of the first layers 21b-1, 21b-2, 21b-3, 21b-4. The interference layer 23b is made of, for example, silicon oxide ($SiO_2$, index of refraction 1.45).

The planarizing layers 40r, 40g, 40b cover the multi-layer interference filters 20r, 20g, 20b, respectively. Thus, the planarizing layers 40r, 40g, 40b alleviate the step difference among the multi-layer interference filters 20r, 20g, 20b, and provide a flat surface. The planarizing layers 40r, 40g, 40b are made of predetermined resin or oxide film (e.g., $SiO_2$), for example.

The microlenses 50r, 50g, 50b are arranged above the planarizing layers 40r, 40g, 40b, respectively. Each microlens 50r, 50g, 50b thus collects the incident light at the photoelectric conversion layers 11r, 11g, 11b via the multi-layer interference filters 20r, 20g, 20b. The micro-lenses 50r, 50g, 50b are made of predetermined resin, for example.

A common portion in the configuration of a plurality of guided mode resonant gratings 60r, 60g, 60b having different transparent wavelength regions from each other will now be described using FIG. 2A. In describing the common portion, the guided mode resonant gratings 60r, 60g, 60b will be simply described as the guided mode resonant grating 60. FIG. 2A is a cross-sectional view illustrating a configuration of the guided mode resonant grating 60.

The guided mode resonant grating 60 includes a plurality of diffraction gratings 61-1 to 61-6, a plurality of inter-grating regions 64-1 to 64-5, an insulating layer 65, and an insulating layer 66. The plurality of diffraction gratings 61-1 to 61-6 and the plurality of inter-grating regions 64-1 to 64-5 are each arranged between the insulating layer 65 and the insulating layer 66.

The plurality of diffraction gratings 61-1 to 61-5 are periodically arrayed at least one-dimensionally between the insulating layer 65 and the insulating layer 66. For instance, the plurality of diffraction gratings 61-1 to 61-5 have a plurality of line patterns, which plurality of line patterns are periodically arrayed one-dimensionally (see FIG. 3A and FIG. 3B). Alternatively, for example, the plurality of diffraction gratings 61-1 to 61-5 have a plurality of inter-hole pattern regions, which plurality of inter-hole pattern regions are periodically arrayed two-dimensionally (see FIG. 4A and FIG. 4B). Alternatively, for example, the plurality of diffraction gratings 61-1 to 61-5 have a plurality of columnar patterns, which plurality of columnar patterns are periodically arrayed two-dimensionally (see FIG. 5A and FIG. 5B).

The plurality of inter-grating regions 64-1 to 64-5 illustrated in FIG. 2A are arranged between the plurality of diffraction gratings 61-1 to 61-5 at between the insulating layer 65 and the insulating layer 66. Each inter-grating region 64-1 to 64-5 includes an insulating film region and an air gap region. For instance, the inter-grating region 64-1 includes an insulating film region 62-1 and an air gap region 63-1. For instance, the inter-grating region 64-5 includes an insulating film region 62-5 and an air gap region 63-5.

The insulating film regions 62-1 to 62-5 are arranged between the diffraction gratings 61-1 to 61-5 and the air gap regions 63-1 to 63-5 at between the insulating layer 65 and the insulating layer 66. The index of refraction of the insulating film regions 62-1 to 62-5 is lower than the index of refraction of the diffraction gratings 61-1 to 61-5. The insulating film regions 62-1 to 62-5 are, for example, made of silicon oxide ($SiO_2$, index of refraction 1.45). The diffraction gratings 61-1 to 61-5 are, for example, made of polysilicon (index of refraction 3 to 4.5).

The air gap regions 63-1 to 63-5 are arranged between the insulating film regions 62-1 to 62-5 at between the insulating layer 65 and the insulating layer 66. The index of refraction of the air gap regions 63-1 to 63-5 is lower than the index of refraction of the insulating film regions 62-1 to 62-5 and lower than the index of refraction of the diffraction gratings 61-1 to 61-5. The air gap region 63-5 is filled with air (index of refraction 1), for example.

Figure 6:
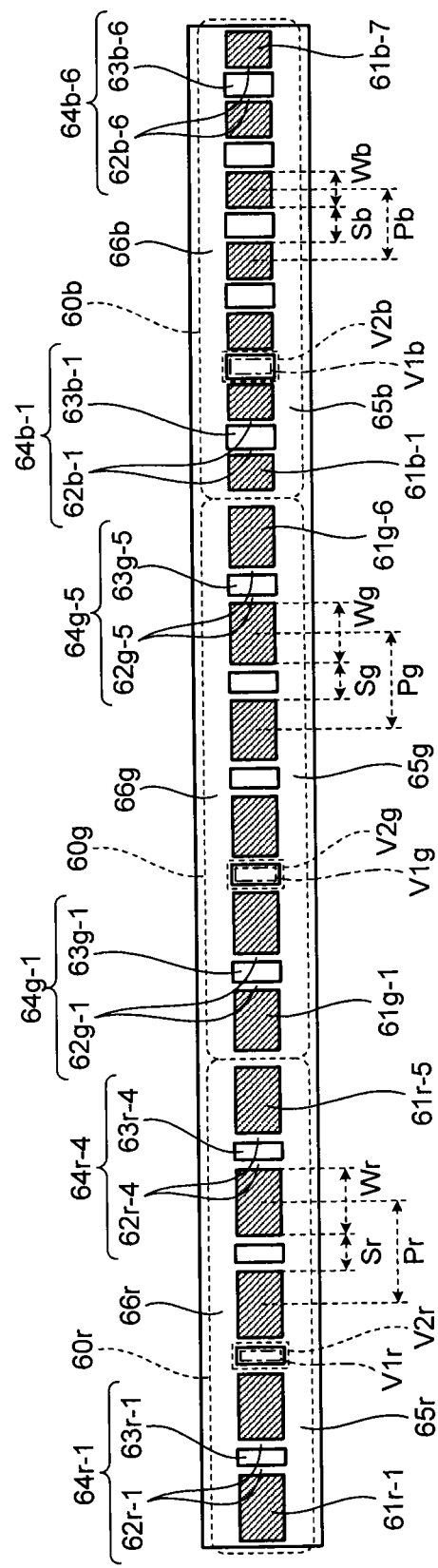
FIG. 6 is a view illustrating the difference in configuration for every transparent wavelength region of the guided mode resonant grating according to the embodiment.
Figure 9A:
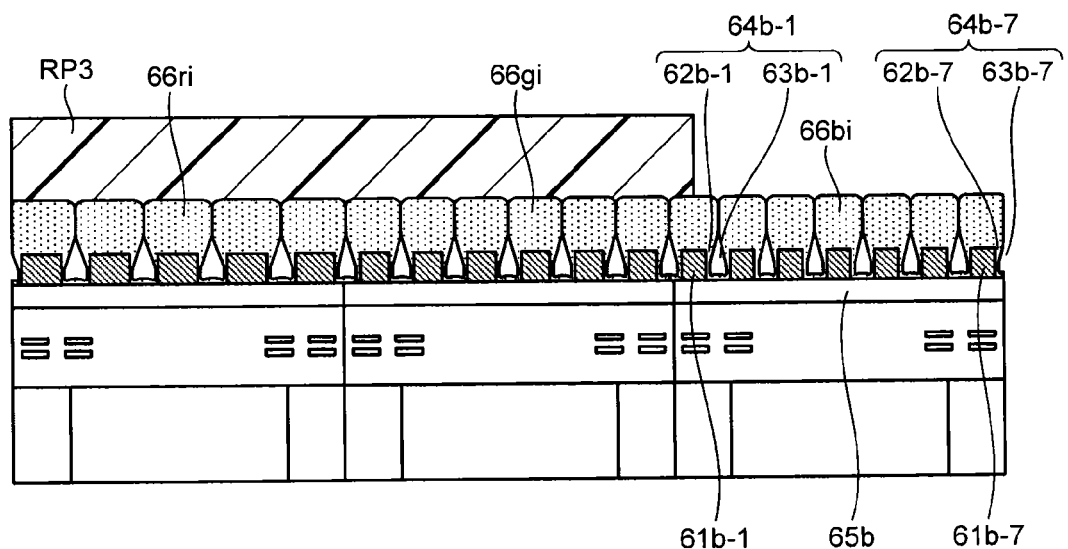
FIG. 9A and FIG. 9B are views illustrating a manufacturing method of the solid-state imaging device according to the embodiment.

FIGS. 1, 2A, and 6 schematically illustrate the insulating film regions 62-1 to 62-5 and the air gap regions 63-1 to 63-5, where the specific shape of the insulating film regions 62-1 to 62-5 and the air gap regions 63-1 to 63-5 depends on the manufacturing method, and may be as illustrated in FIG. 9A, for example. A structure illustrated in FIG. 9A will be described with reference numerals of FIG. 2.

The insulating film regions 62-1 to 62-5 illustrated in FIG. 9A cover side surfaces of the diffraction gratings 61-1 to 61-5, and also cover a portion between the diffraction gratings 61-1 to 61-5 at the upper surface of the insulating layer 65. The film thickness (width in a direction along the surface of the semiconductor substrate 10) of the insulating film regions 62-1 to 62-5 covering the side surfaces of the diffraction gratings 61-1 to 61-5 gradually becomes thicker towards the upper surface of the insulating layer 66. The insulating film regions 62-1 to 62-5 covering the side surfaces of the diffraction gratings 61-1 to 61-5 cover side portions of the air gap regions 63-1 to 63-5. The insulating film regions 62-1 to 62-5 covering a portion between the diffraction gratings 61-1 to 61-5 at the upper surface of the insulating layer 65 have an even film thickness. The insulating film regions 62-1 to 62-5 covering a portion between the diffraction gratings 61-1 to 61-5 at the upper surface of the insulating layer 65 covers bottom portions of the air gap regions 63-1 to 63-5. Furthermore, the insulating film regions 62-1 to 62-5 illustrated in FIG. 9A cover a virtual surface in which the side surfaces of the diffraction gratings 61-1 to 61-5 are extended to the vicinity of the upper surface and to the front of the upper surface of the insulating layer 66. The film thickness of the insulating film regions 62-1 to 62-5 covering such virtual surface also gradually becomes thicker towards the upper surface of the insulating layer 66.

In a cross-sectional view, the air gap regions 63-1 to 63-5 illustrated in FIG. 9A has a substantially triangular shape that projects out from between the diffraction gratings 61-1 to 61-5 to the vicinity of the upper surface and to the front of the upper surface of the insulating layer 66. In other words, the air gap regions 63-1 to 63-5 project out to a position higher than the upper surface of the diffraction gratings 61-1 to 61-5. The air gap regions 63-1 to 63-5 have a width in a direction parallel to the surface of the semiconductor substrate 10 (see FIG. 1) gradually becoming smaller towards the upper surface of the insulating layer 66.

In other words, in the structure illustrated in FIG. 9A, the inter-grating regions 64-1 to 64-5 including the insulating film regions 62-1 to 62-5 and the air gap regions 63-1 to 63-5 not only include the region between the diffraction gratings 61-1 to 61-5 but also a region where such region is extended to the vicinity of the upper surface and to the front of the upper surface of the insulating layer 66. That is, the inter-grating regions 64-1 to 64-5 are assumed to be extended to positions higher than the upper surfaces of the diffraction gratings 61-1 to 61-5. According to the structure illustrated in FIG. 9A, the volume of the inter-grating regions 64-1 to 64-5 can be greatly ensured compared to the diffraction gratings 61-1 to 61-5. The resonance effect by the guided mode resonant grating 60 can be easily enhanced compared to when the inter-grating region and the air gap region include only the region between the diffraction gratings 61-1 to 61-5.

A proportion of a volume V1 of the air gap regions 63-1 to 63-5 occupying a volume V2 of the inter-grating regions 64-1 to 64-5 illustrated in FIG. 2 is greater than or equal to 50% and smaller than or equal to 90%. If the proportion of the volume of the air gap regions 63-1 to 63-5 occupying the volume of the inter-grating regions 62-1 to 62-5 is smaller than 50%, the difference between the average index of refraction of the inter-grating regions 64-1 to 64-5 and the index of refraction of the diffraction gratings 61-1 to 61-5 becomes small and the removal performance of the mixed color component by the guided mode resonant grating 60 may not meet the required specification. If the proportion of the volume of the air gap regions 63-1 to 63-5 occupying the volume of the inter-grating regions 64-1 to 64-5 is greater than 90%, the structure of the guided mode resonant grating 60 as illustrated in FIG. 2A becomes difficult to manufacture.

Figure 3A:
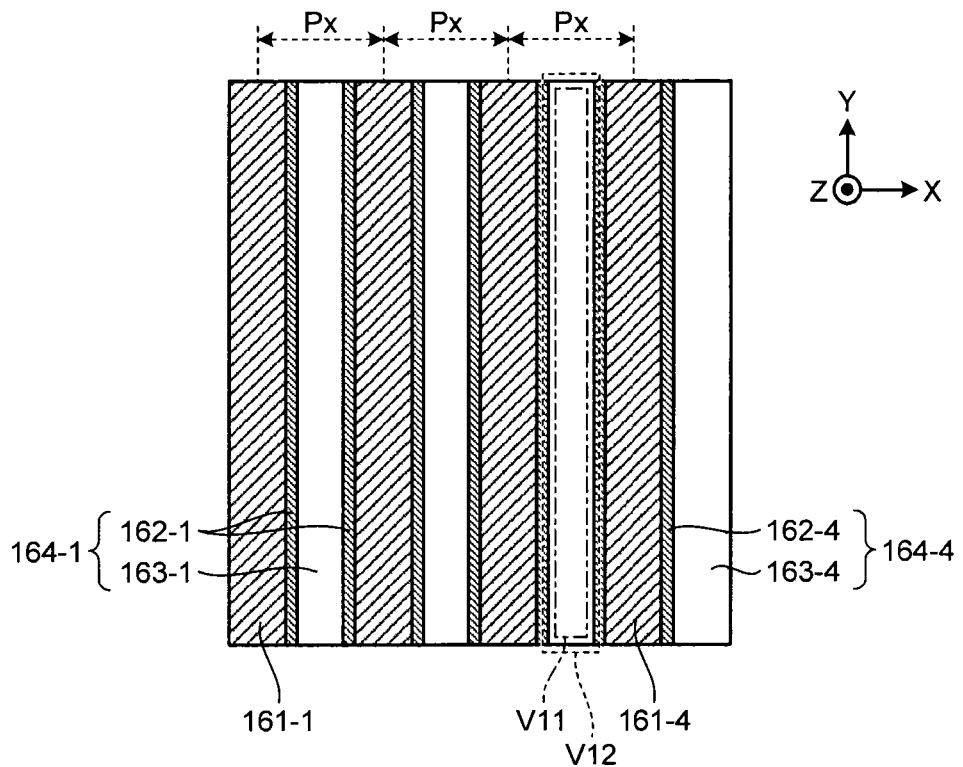
FIG. 3A and FIG. 3B are views illustrating a configuration example of a guided mode resonant grating according to the embodiment.
Figure 4A:
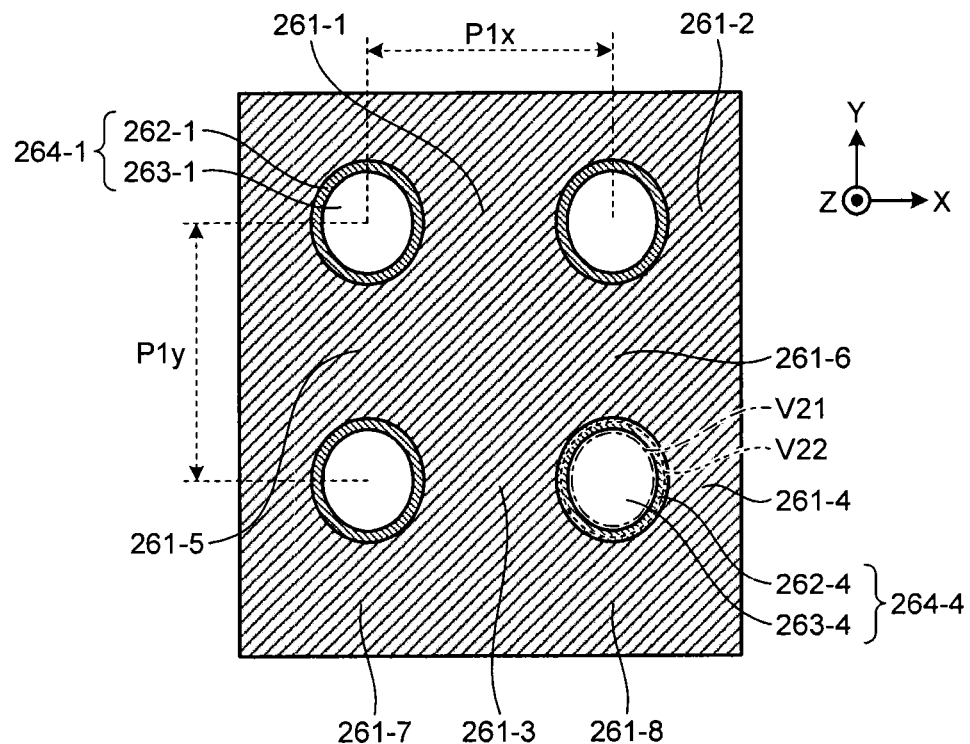
FIG. 4A and FIG. 4B are views illustrating another configuration example of the guided mode resonant grating according to the embodiment.
Figure 4B:
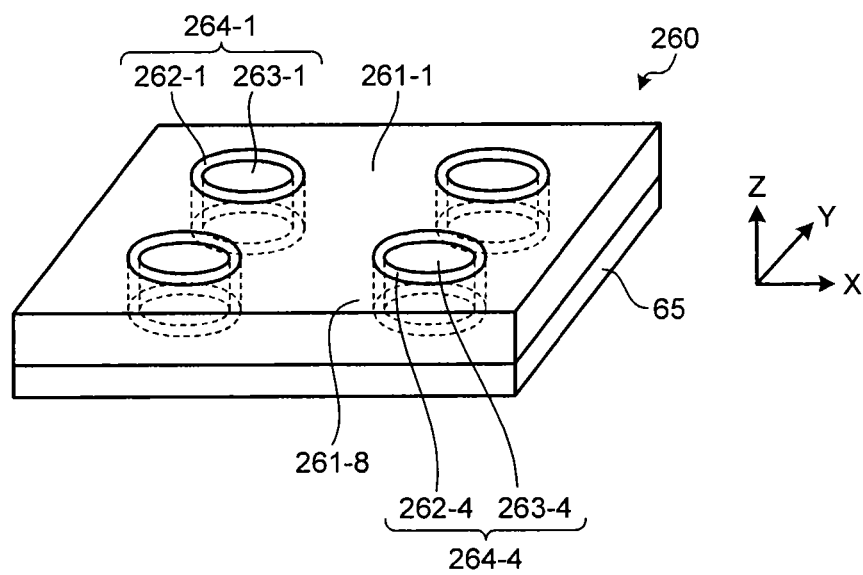
Figure 5A:
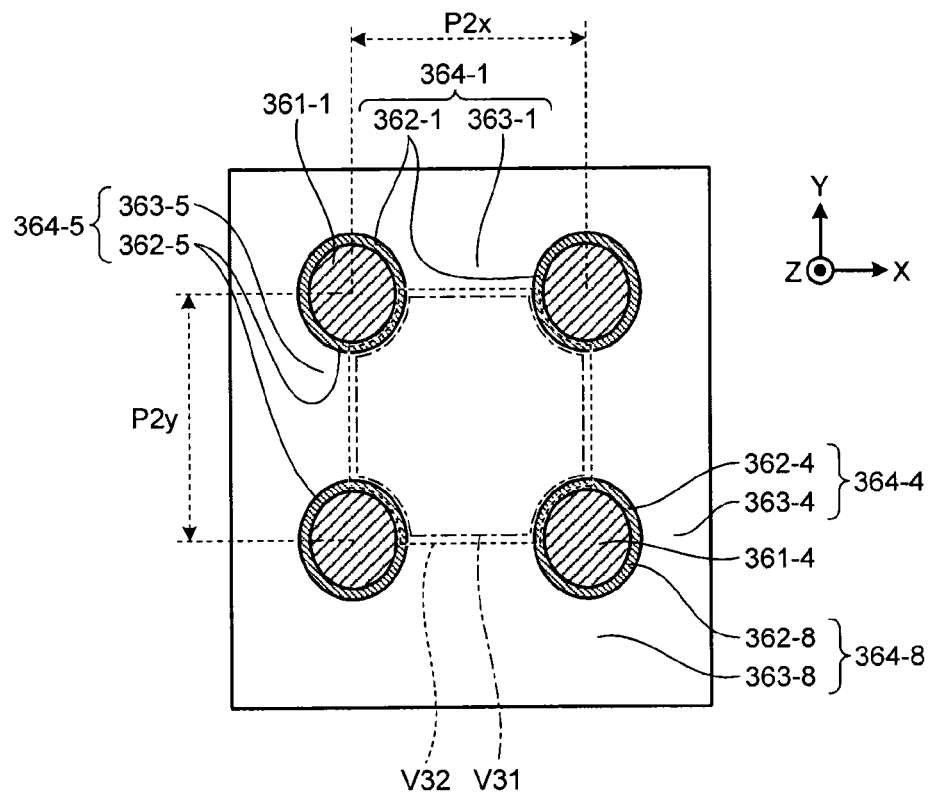
FIG. 5A and FIG. 5B are views illustrating another further configuration example of the guided mode resonant grating according to the embodiment.
Figure 5B:
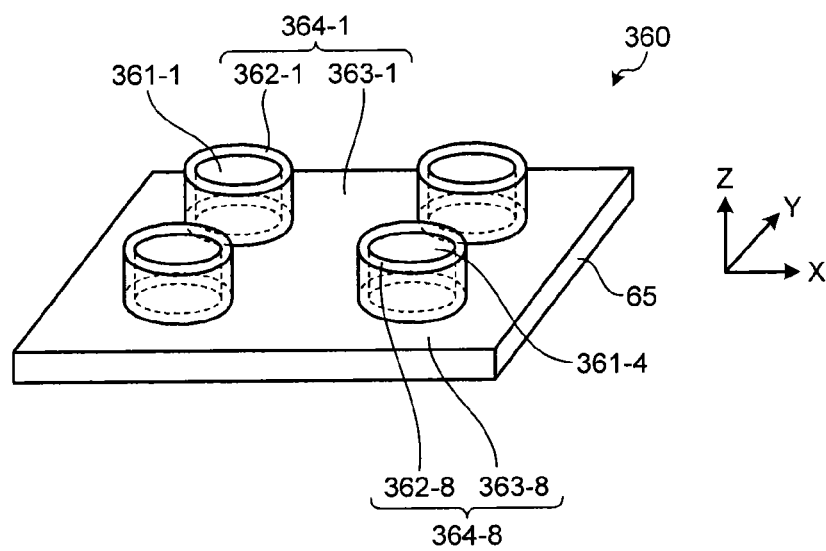

A specific configuration example of the guided mode resonant grating 60 will now be described using FIG. 3A to FIG. 5B. FIG. 3A, FIG. 4A, and FIG. 5A are plan views illustrating a configuration of the guided mode resonant grating 60, and FIG. 3B, FIG. 4B, and FIG. 5B are perspective views illustrating a configuration of the guided mode resonant grating 60.

Figure 3B:
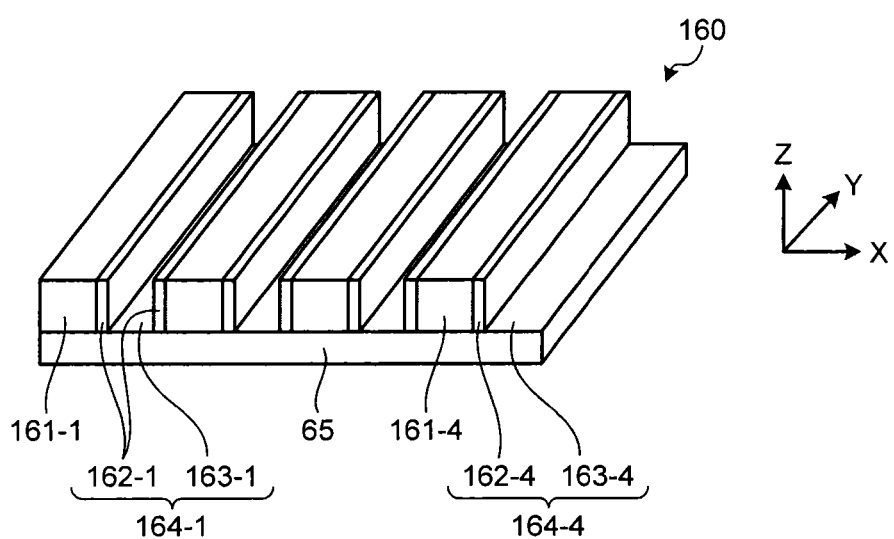

For instance, in the guided mode resonant grating 160 illustrated in FIG. 3A and FIG. 3B, a plurality of line patterns 161-1 to 161-4 are respectively extended in the Y direction and arrayed at a constant pitch Px in the X direction. The plurality of line patterns 161-1 to 161-4 have equal line width with respect to each other, where a space formed with the adjacent line pattern is also equal with each other. Each line pattern 161-1 to 161-4 functions as the diffraction grating.

Each space pattern 164-1 to 164-4 functions as the inter-grating region, and includes insulating film regions 162-1 to 162-4 and air gap regions 163-1 to 163-4.

Each insulating film region 162-1 to 162-4 is arranged on a side wall of the line patterns 161-1 to 161-4, and is extended in the Y direction. Each insulating film region 162-1 to 162-4 has a substantially fin shape projecting out in the Z direction and extending in the Y direction, for example. Each air gap region 163-1 to 163-4 is arranged between two substantially fin shapes of the insulating film regions 162-1 to 162-4, and is extended in the Y direction between the two substantially fin shapes.

A proportion of a volume V11 of the air gap regions 163-1 to 163-4 occupying a volume V12 of the inter-grating regions 164-1 to 164-4 is greater than or equal to 50% and smaller than or equal to 90%.

For instance, in a guided mode resonant grating 260 illustrated in FIG. 4A and FIG. 4B, a plurality of hole patterns 264-1 to 264-4 are passed through and extended between the insulating layer 65 and the insulating layer 66, and arrayed at constant pitches P1x, P1y in the X direction and the Y direction, respectively. The plurality of hole patterns 264-1 to 264-4 have equal planar width with respect to each other, and a space formed with the adjacent hole pattern is also equal with each other.

A plurality of inter-hole pattern regions 261-1 to 261-4 are arrayed at constant pitches P1x, P1y in the X direction and the Y direction, respectively. A plurality of inter-hole pattern regions 261-5 to 261-8 are arrayed at constant pitches P1x, P1y in the X direction and the Y direction, respectively. A plurality of inter-hole pattern regions 261-1 to 261-8 function as the diffraction grating.

Each hole pattern 264-1 to 264-4 functions as the inter-grating region, and includes insulating film regions 262-1 to 262-4 and an air gap regions 263-1 to 263-4.

Each insulating film region 262-1 to 262-4 is arranged on an inner side surface of the hole patterns 264-1 to 264-4 and is passed through and extended between the insulating layer 65 and the insulating layer 66. Each insulating film region 262-1 to 262-4 has a substantially cylindrical shape extending in the Z direction, for example. Each air gap region 263-1 to 263-4 is, for example, arranged on an inner side of the substantially cylindrical shape of the insulating film regions 262-1 to 262-4, and is passed through and extended in the Z direction between the insulating layer 65 and the insulating layer 66 on the inner side of the substantially cylindrical shape.

A proportion of a volume V21 of the air gap region 263-1 to 263-4 occupying a volume V22 of the inter-grating regions 264-1 to 264-4 is greater than or equal to 50% and smaller than or equal to 90%.

For instance, in a guided mode resonant grating 360 illustrated in FIG. 5A and FIG. 5B, a plurality of columnar patterns 361-1 to 361-4 are passed through and extended between the insulating layer 65 and the insulating layer 66, and arrayed at constant pitches P2x, P2y in the X direction and the Y direction, respectively. A plurality of columnar patterns 361-1 to 361-4 have equal planar width with respect to each other and a space formed with the adjacent columnar pattern is also equal with each other. Each columnar pattern 361-1 to 361-4 functions as the diffraction grating.

A plurality of inter-columnar pattern regions 364-1 to 364-4 are arrayed at constant pitches P2x, P2y in the X direction and the Y direction, respectively. A plurality of inter-columnar pattern regions 364-5 to 364-8 are arrayed at constant pitches P2x, P2y in the X direction and the Y direction, respectively. The plurality of inter-columnar pattern regions 364-1 to 364-8 function as the inter-grating region, and includes insulating film regions 362-1 to 362-8 and air gap regions 363-1 to 363-8.

Each insulating film region 362-1 to 362-8 is arranged on a side surface of the columnar patterns 361-1 to 361-4, and is extended in the Z direction. Each insulating film region 362-1 to 362-8 includes one part of a cylindrical shape extending in the Z direction, for example. Each air gap region 363-1 to 363-8 is, for example, arranged on an outer side of the cylindrical shape of the insulating film regions 362-1 to 362-8, and is passed through and extended in the Z direction between the insulating layer 65 and the insulating layer 66 on the outer side of the cylindrical shape.

A proportion of a volume V31 of the air gap region 363-1 to 363-4 occupying a volume V32 of the inter-grating regions 364-1 to 364-4 is greater than or equal to 50% and smaller than or equal to 90%.

A different portion in the configuration of a plurality of guided mode resonant gratings 60r, 60g, 60b having different transparent wavelength regions from each other will now be described using FIG. 6. FIG. 6 is a cross-sectional view illustrating a configuration of a plurality of guided mode resonant gratings 60r, 60g, 60b.

As illustrated in FIG. 6, an arrangement pitch of a plurality of diffraction gratings differs among the plurality of guided mode resonant gratings 60r, 60g, 60b having different transparent wavelength regions from each other. In other words, assuming the arrangement pitch of the diffraction gratings 61r-1 to 61r-5 in the guided mode resonant grating 60r is Pr, the arrangement pitch of the diffraction gratings 61g-1 to 61g-6 in the guided mode resonant grating 60g is Pg, and the arrangement pitch of the diffraction gratings 61b-1 to 61b-7 in the guided mode resonant grating 60b is Pb, for example, the relationship of the following mathematical expression 1 can be met.

$$Pr > Pg > Pb \qquad \text{mathematical expression 1}$$

As illustrated in the mathematical expression 1, the arrangement pitch of the plurality of diffraction gratings is increased the more the transparent wavelength region is on the long wavelength side, and the arrangement pitch of the plurality of diffraction gratings is reduced the more the transparent wavelength region is on the short wavelength side.

In accordance thereto, assuming the width of the diffraction gratings 61r-1 to 61r-5 in the guided mode resonant grating 60r is Wr, the width of the diffraction gratings 61g-1 to 61g-6 in the guided mode resonant grating 60g is Wg, and the width of the diffraction gratings 61b-1 to 61b-7 in the guided mode resonant grating 60b is Wb, for example, the relationship of the following mathematical expression 2 can be met.

$$Wr > Wg > Wb \qquad \text{mathematical expression 2}$$

Assuming the space of the diffraction gratings 61r-1 to 61r-5 in the guided mode resonant grating 60r is Sr, the space of the diffraction gratings 61g-1 to 61g-6 in the guided mode resonant grating 60g is Sg, and the space of the diffraction gratings 61b-1 to 61b-7 in the guided mode resonant grating 60b is Sb, for example, the relationship of the following mathematical expression 3 can be met.

$$Sr \approx Sg \approx Sb \qquad \text{mathematical expression 3}$$

Alternatively, the following mathematical expressions 4, 5 may be met in place of the mathematical expressions 2, 3.

$$Wr \approx Wg \approx Wb \qquad \text{mathematical expression 4}$$

$$Sr > Sg > Sb \qquad \text{mathematical expression 5}$$

The proportion of the volume of the air gap region occupying the volume of the inter-grating region differs among the plurality of guided mode resonant gratings 60r, 60g, 60b having different transparent wavelength regions with each other. In other words, assume the proportion of a volume V1r of the air gap regions 63r-1 to 63r-4 occupying a volume V2r of the inter-grating regions 64r-1 to 64r-4 in the guided mode resonant grating 60r is (V1r)/(V2r). Assume the proportion of a volume V1g of the air gap regions 63g-1 to 63g-5 occupying a volume V2g of the inter-grating regions 64g-1 to 64g-5 in the guided mode resonant grating 60g is (V1g)/(V2g). Assume the proportion of a volume V1b of the air gap regions 63b-1 to 63b-6 occupying a volume V2b of the inter-grating regions 64b-1 to 64b-6 in the guided mode resonant grating 60b is (V1b)/(V2b). In this case, the relationship of the following mathematical expression 6 is met.

$$(V1r)/(V2r) < (V1g)/(V2g) < (V1b)/(V2b) \qquad \text{mathematical expression 6}$$

As illustrated in the mathematical expression 2, the proportion of the volume of the air gap region occupying the volume of the inter-grating region is reduced (within a range of greater than or equal to 50% and smaller than or equal to 90%) the more the transparent wavelength region is on the long wavelength side, and the proportion of the volume of the air gap region occupying the volume of the inter-grating region is increased (within a range of greater than or equal to 50% and smaller than or equal to 90%) the more the transparent wavelength region is on the short wavelength side.

A manufacturing method of the solid-state imaging device 1 according to the embodiment will now be described using FIG. 7A to FIG. 9B. FIG. 7A to FIG. 9B are step cross-sectional views illustrating the manufacturing method of the solid-state imaging device 1 according to the embodiment. FIG. 1 is used as a step cross-sectional diagram following FIG. 9B.

Figure 7A:
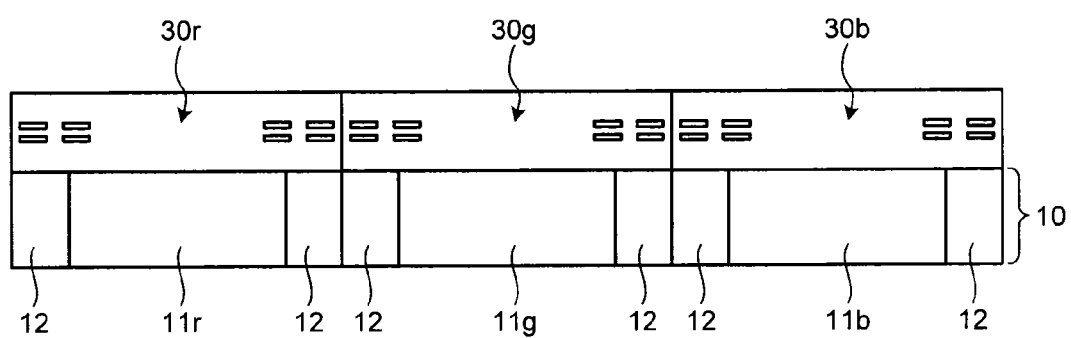
FIG. 7A and FIG. 7B are views illustrating a manufacturing method of the solid-state imaging device according to the embodiment.

In the step illustrated in FIG. 7A, the photoelectric conversion layers 11r, 11g, 11b, each including the charge accumulating region, are formed in the well region 12 of the semiconductor substrate 10 through ion implantation method, and the like. The well region 12 forms the semiconductor (e.g., silicon) containing the impurities of the first conductivity type (e.g., P type) at low concentration. The charge accumulating region in the photoelectric conversion layer 11r, 11g, 11b is formed by implanting the impurities of the second conductivity type (e.g., N type), which is the opposite conductivity type of the first conductivity type, into the well region 12 of the semiconductor substrate 10 at the concentration higher than the concentration of the impurities of the first conductivity type in the well region 12.

The inter-layer insulting film covering the semiconductor substrate 10 is formed by depositing $SiO_2$, for example, through the CVD method and the like. The process of forming the wiring pattern on the inter-layer insulating film with metal, for example, through the sputtering method, the lithography method, and the like and forming the inter-layer insulating film covering the inter-layer insulating film and the wiring pattern with $SiO_2$, for example, through the CVD method and the like is repeatedly carried out. The multi-layer wiring structures 30r, 30g, 30b are thereby formed.

Figure 7B:
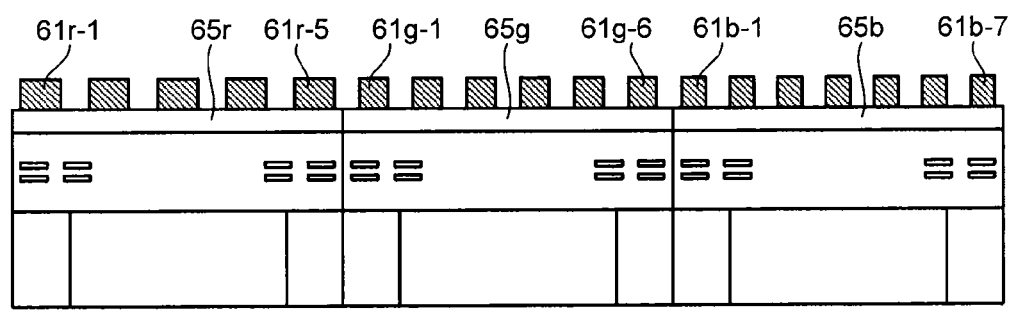

In the step illustrated in FIG. 7B, the insulating layers 65r, 65g, 65b to become the lower part of the guided mode resonant gratings 60r, 60g, 60b are formed through the CVD method and the like. The insulating layers 65r, 65g, 65b are formed on the multi-layer wiring structures 30r, 30g, 30b, for example.

A polysilicon film is deposited on the insulating layers 65r, 65g, 65b through the CVD method and the like. The polysilicon film is deposited to a thickness of 100 to 200 nm, for example. The deposited polysilicon film is patterned through a photolithography process and an etching process. The plurality of diffraction gratings 61r-1 to 61r-5, 61g-1 to 61g-6, and 61b-1 to 61b-7 are thereby formed. The planar width of each diffraction grating 61r-1 to 61r-5, 61g-1 to 61g-6, and 61b-1 to 61b-7 is, for example, 80 to 100 nm. The space of the plurality of diffraction gratings 61r-1 to 61r-5, 61g-1 to 61g-6, and 61b-1 to 61b-7 is, for example, 60 to 80 nm.

In this case, the plurality of diffraction gratings 61r-1 to 61r-5, 61g-1 to 61g-6, and 61b-1 to 61b-7 may be formed to satisfy the mathematical expressions 1 to 3, or may be formed to satisfy the mathematical expressions 1, 4, and 5.

Furthermore, the pattern of each diffraction grating 61r-1 to 61r-5, 61g-1 to 61g-6, and 61b-1 to 61b-7 may, for example, be a line pattern (see FIG. 3), may be a pattern of the inter-hole pattern region (see FIG. 4), or may be a columnar pattern (see FIG. 5).

Figure 8A:
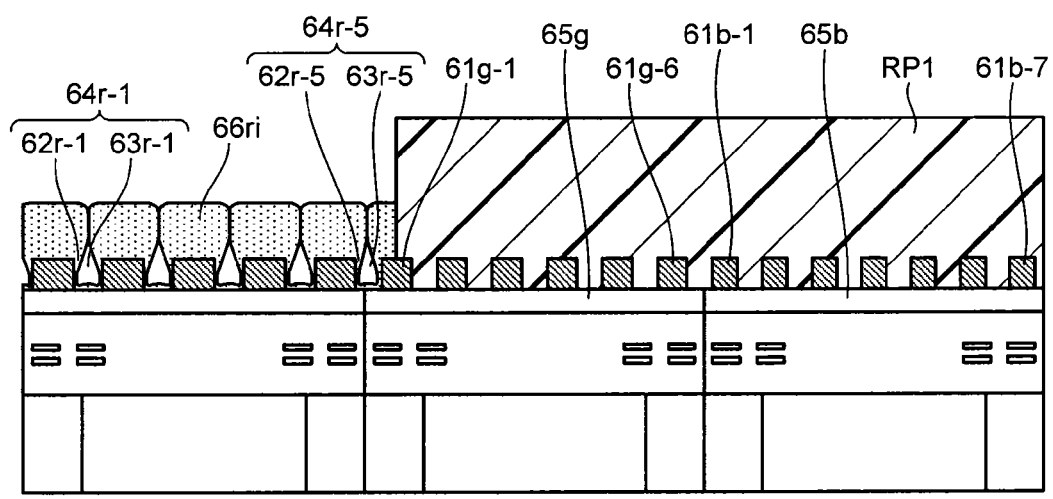
FIG. 8A and FIG. 8B are views illustrating the manufacturing method of the solid-state imaging device according to the embodiment.

In the step illustrated in FIG. 8A, a resist pattern RP1 for selectively covering the insulating layers 65g, 65b and the diffraction gratings 61g-1 to 61g-6, 61b-1 to 61b-7 is formed through the photolithography process and the etching process. In this case, the insulating layer 65r and the diffraction gratings 61r-1 to 61r-5 are exposed.

An oxide film to become the inter-grating regions 64r-1 to 64r-5 and an insulating layer 66r is formed under bad coverage condition using the resist pattern RP1 as a mask. For instance, the oxide film is deposited through the plasma CVD method having silane ($SiH_4$) and oxidized gas as raw gas, and embedded between the diffraction gratings 61r-1 to 61r-5. The oxide film deposited through the plasma CVD method having silane ($SiH_4$) and oxidized gas as raw gas is referred to as P—$SiH_4$ oxide film ("P" stands for plasma) to distinguish from the general oxide film. The P—$SiH_4$ oxide film has the property of being difficult to be embedded in a narrow space, and thus if deposited, the air gap regions 63r-1 to 63r-5 can be formed between the insulating film regions 62r-1 to 62r-5 as illustrated in FIG. 8A. An upper part 66ri higher than the diffraction gratings 61r-1 to 61r-5 in the P—$SiH_4$ oxide film is the portion to become the insulating layer 66r.

The film forming condition of the P—$SiH_4$ oxide film is adjusted so that the proportion of the volume of the air gap regions 63r-1 to 63r-5 occupying the volume of the inter-grating regions 64r-1 to 64r-5 becomes greater than or equal to 50% and smaller than or equal to 90%. Other oxide films may be deposited as long as such oxide films have the property of being difficult to be embedded in the narrow space other than the P—$SiH_4$ oxide film.

Figure 8B:
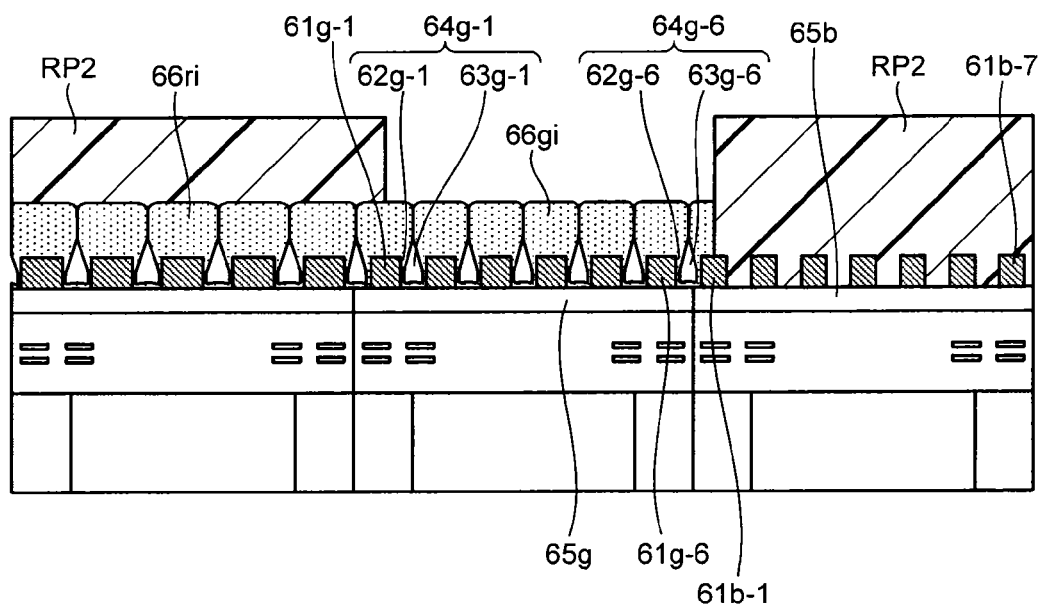

In the step illustrated in FIG. 8B, a resist pattern RP2 for selectively covering the upper part 66ri of the oxide film formed in the step illustrated in FIG. 8A, the insulating layer 65b, and the diffraction gratings 61b-1 to 61b-7 is formed through the photolithography process and the etching process. In this case, the insulating layer 65g and the diffraction gratings 61g-1 to 61g-6 are exposed.

An oxide film to become the inter-grating regions 64g-1 to 64g-5 and an insulating layer 66g is formed under bad coverage condition using the resist pattern RP2 as a mask. For instance, the P—$SiH_4$ oxide film is deposited through the plasma CVD method having silane ($SiH_4$) as raw gas. The P—$SiH_4$ oxide film has the property of being difficult to be embedded in a narrow space, and thus if deposited, the air gap regions 63g-1 to 63g-6 can be formed between the insulating film regions 62g-1 to 62g-6 as illustrated in FIG. 8B. An upper part 66gi higher than the diffraction gratings 61g-1 to 61g-6 in the P—$SiH_4$ oxide film is the portion to become the insulating layer 66g.

The film forming condition of the P—$SiH_4$ oxide film is adjusted so that the proportion of the volume of the air gap regions 63g-1 to 63g-6 occupying the volume of the inter-grating regions 64g-1 to 64g-6 becomes greater than or equal to 50% and smaller than or equal to 90% and so that mathematical equation 8 is satisfied. Other oxide films may be deposited as long as such oxide films have the property of being difficult to be embedded in the narrow space other than the P—$SiH_4$ oxide film.

In the step illustrated in FIG. 9A, a resist pattern RP3 for selectively covering the upper part 66ri of the oxide film formed in the step illustrated in FIG. 8A and the upper part 66gi of the oxide film formed in the step illustrated in FIG. 8B is formed through the photolithography process and the etching process. In this case, the insulating layer 65b and the diffraction gratings 61b-1 to 61b-7 are exposed.

An oxide film to become the inter-grating regions 64b-1 to 64b-7 and an insulating layer 66b is formed under bad coverage condition using the resist pattern RP3 as a mask. For instance, the P—$SiH_4$ oxide film is deposited through the plasma CVD method having silane ($SiH_4$) as raw gas. The P—$SiH_4$ oxide film has the property of being difficult to be embedded in a narrow space, and thus if deposited, the air gap regions 63b-1 to 63b-7 can be formed between the insulating film regions 62b-1 to 62b-7 as illustrated in FIG. 9A. An upper part 66bi higher than the diffraction gratings 61b-1 to 61b-7 in the P—$SiH_4$ oxide film is the portion to become the insulating layer 66b.

The film forming condition of the P—$SiH_4$ oxide film is adjusted so that the proportion of the volume of the air gap regions 63b-1 to 63b-7 occupying the volume of the inter-grating regions 64b-1 to 64b-7 becomes greater than or equal to 50% and smaller than or equal to 90% and so that the mathematical equation 8 is satisfied. Other oxide films may be deposited as long as such oxide films have the property of being difficult to be embedded in the narrow space other than the P—$SiH_4$ oxide film.

Figure 9B:
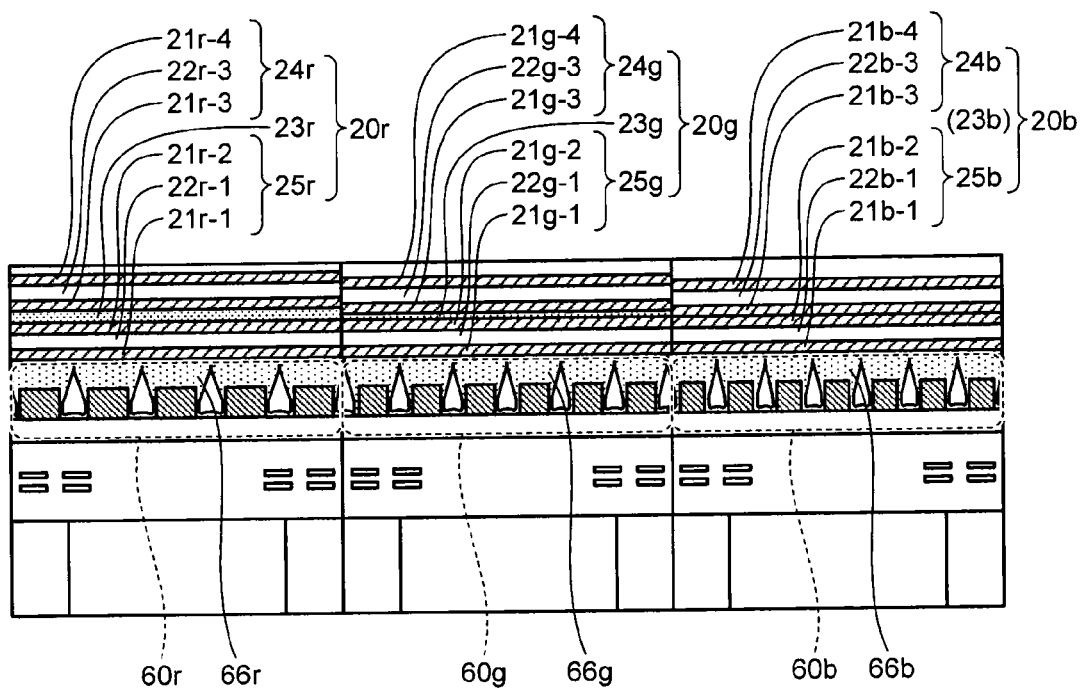

In the step illustrated in FIG. 9B, the upper parts 66ri, 66gi, 66bi of the oxide films (e.g., P—$SiH_4$ oxide film) formed in FIG. 8A to FIG. 9A are planarized through the CMP method and the like to form the insulating layers 66r, 66g, 66b.

The guided mode resonant gratings 60r, 60g, 60b are thereby formed.

The lower stacked structures 25r, 25g, 25b to become the lower part of the multi-layer interference filters 20r, 20g, 20b are then formed. Specifically, the lower stacked structures 25r, 25g, 25b are formed by carrying out the process of simultaneously depositing the first layers 21r-1, 21g-1, and 21b-1, simultaneously depositing the second layers 22r-1, 22g-1, and 22b-1, and simultaneously depositing the first layers 21r-2, 21g-2, and 21b-2 in order. Each first layer 21r-1 to 21b-2 is formed of titanium oxide (TiO$_2$), for example, through the sputtering method and the like. Each first layer 21r-1 to 21b-2 is formed to the same film thickness. Each first layer 21r-1 to 21b-2 is formed to the film thickness such that an optical film thickness is ¼ of the center wavelength (e.g., 550 nm), for example. That is, each first layer 21r-1 to 21b-2 is formed to a film thickness d1 that satisfies the mathematical equation 7

$$n1 \times d1 = (¼) \times \lambda \qquad \text{mathematical equation 7}$$

where n1 is the index of refraction of the material (e.g., TiO$_2$), and λ is the center wavelength.

Substituting n1=2.5 and λ=550 nm to the mathematical equation 7, d1=55 nm is obtained. The second layers 22r-1, 22g-1, and 22b-1 are formed of silicon oxide (SiO$_2$), for example, through the CVD method and the like. Each second layer 22r-1, 22g-1, and 22b-1 is formed to the film thickness such that the optical film thickness is ¼ of the center wavelength (e.g., 550 nm), for example. That is, each second layer 22r-1, 22g-1, and 22b-1 is formed to a film thickness d2 that satisfies the mathematical equation 8

$$n2 \times d2 = (¼) \times \lambda \qquad \text{mathematical equation 8}$$

where n2 is the index of refraction of the material (e.g., SiO$_2$), and λ is the center wavelength.

For instance, substituting n2=1.46 and λ=550 nm to the mathematical equation 8, d2=94 nm is obtained.

The lower stacked structure 25r in which the first layer 21r-1, the second layer 22r-1 and the first layer 21r-2 are stacked in order is thereby formed. The lower stacked structure 25g in which the first layer 21g-1, the second layer 22g-1, and the first layer 21g-2 are stacked in order is formed. The lower tacked structure 25b in which the first layer 21b-1, the second layer 22b-1, and the first layer 21b-2 are stacked in order is formed.

A layer (not illustrated) to become the interference layers 23r, 22g is then formed on the first layers 21r-1, 21g-1, and 21b-1 through the CVD method and the like. The layer to become the interference layer is formed to a film thickness (e.g., 85 nm) corresponding to a red waveband. A resist pattern (not illustrated) for covering the portion (interference layer 23r) corresponding to the upper side of the photoelectric conversion layer 11r in the layer is formed through the lithography method. In this case, the portion corresponding to the upper side of the photoelectric conversion layers 11g, 11b in the layer to become the interference layer is exposed.

The portion corresponding to the upper side of the photoelectric conversion layers 11g, 11b in the layer to become the interference layer is etched (half etched) and thinned to the film thickness (e.g., 35 nm) corresponding to the green waveband with the resist pattern as the mask through the dry etching method. The interference layer 23g is thereby formed at the portion corresponding to the photoelectric conversion layer 11g in the layer to become the interference layer. Thereafter, the resist pattern is removed.

A resist pattern for covering the portion (interference layer 23r and interference layer 23g) corresponding to the upper side of the photoelectric conversion layers 11r, 11g in the layer to become the interference layer is formed through the lithography method. In this case, the portion corresponding to the upper side of the photoelectric conversion layer 11b in the layer to become the interference layer is exposed.

A portion 23ib1 corresponding to the upper side of the photoelectric conversion layer 11b in the layer to become the interference layer is etched and removed with the resist pattern as the mask through the dry etching method. The virtual interference layer 23b having a film thickness of 0 nm is thereby formed at the portion corresponding to the photoelectric conversion layer 11b while leaving the interference layer 23r and the interference layer 23g in the layer to become the interference layer. Thereafter, the resist pattern is removed.

The upper stacked structures 24r, 24g, 24b to become the upper part of the multi-layer interference filters 20r, 20g, 20b are then formed. Specifically, the upper stacked structures 24r, 24g, 24b are formed by carrying out the process of simultaneously depositing the first layers 21r-3, 21g-3, and 21b-3, simultaneously depositing the second layers 22r-3, 22g-3, and 22b-3, and simultaneously depositing the first layers 21r-4, 21g-4, and 21b-4 in order. Each first layer 21r-3 to 21b-4 is formed of titanium oxide (TiO$_2$), for example, through the sputtering method and the like. Each first layer 21r-3, 21g-3, and 21b-3 is formed to the equal film thickness as the first layers 21r-1 to 21b-2 and the first layers 21r-4, 21g-4, and 21b-4. Each second layer 22r-3, 22g-3, and 22b-3 are formed of silicon oxide (SiO$_2$), for example, through the CVD method and the like. The second layers 22r-3, 22g-3, and 22b-3 are formed to the equal film thickness as the second layers 22r-1, 22g-1, and 22b-1.

The multi-layer interference filters 20r, 20g, 20b are thereby formed.

In the step illustrated in FIG. 1, a film covering the multi-layer interference filters 20r, 20g, 20b is formed by depositing, for example, predetermined resin or oxide film (e.g., SiO$_2$), and the surface of the formed film is planarized through the CMP method. The planarizing layers 40r, 40g, 40b having a flat surface are thereby formed. The microlenses 50r, 50g, 50b are formed of, for example, predetermined resin on the planarizing layers 40r, 40g, 40b.

Figure 10A:
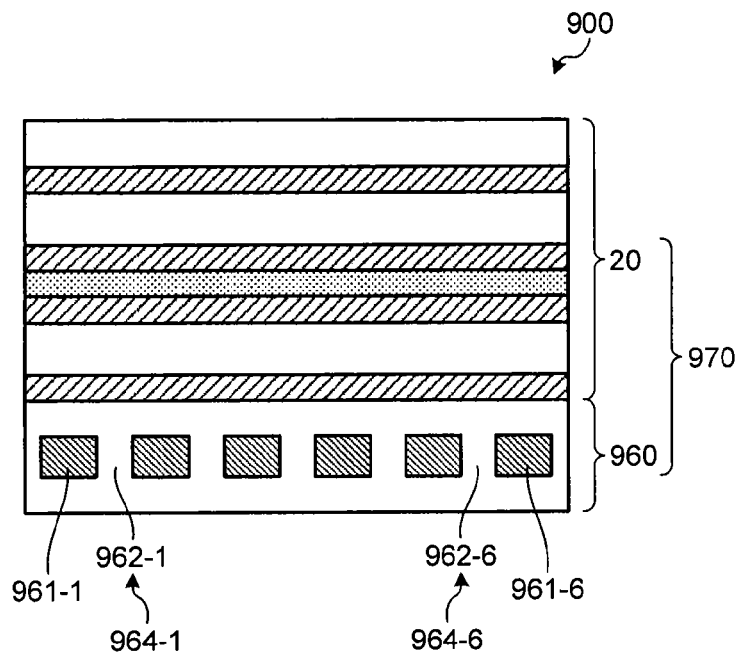
FIG. 10A and FIG. 10B are views illustrating a comparative example.
Figure 10B:
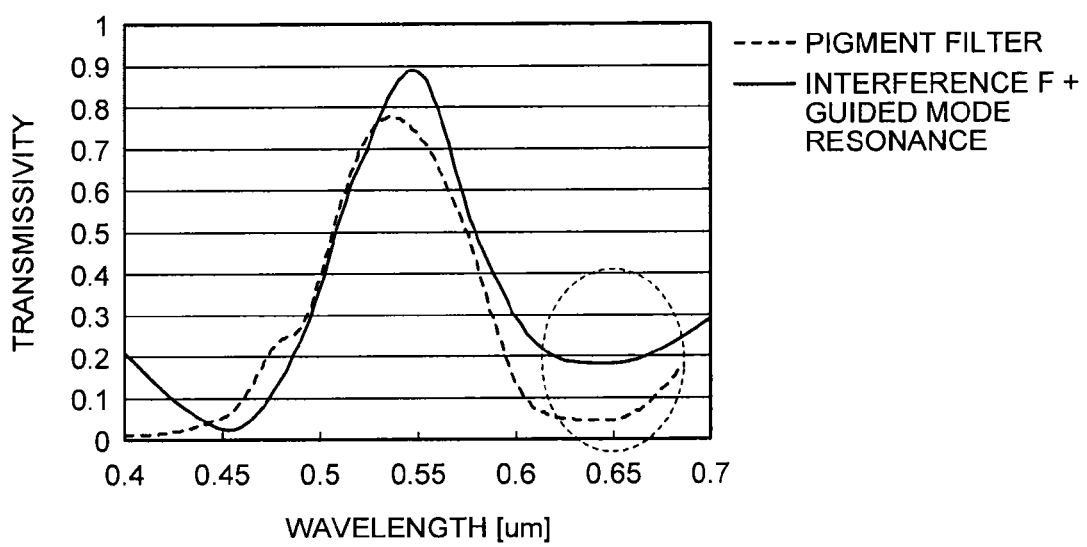

Consider a case where a guided mode resonant grating 960 of the color filter 970 does not have the air gap region in the solid-state imaging device 900, as illustrated in FIG. 10A. Specifically, in the guided mode resonant grating 960, each of a plurality of inter-grating regions 964-1 to 964-5 arranged between a plurality of diffraction gratings 961-1 to 961-6 includes an insulating film regions 962-1 to 962-5 but does not include an air gap region. In this case, the material that can be used for the diffraction gratings 961-1 to 961-6 and the inter-grating regions 964-1 to 964-5 to satisfy the resonance condition are limited, and there is a tendency that the specification in which the removal performance of the mixed color component by the guided mode resonant grating 960 is demanded may not be met since the difference between the index of refraction of the diffraction gratings 961-1 to 961-6 and the index of refraction of the inter-grating regions 964-1 to 964-5 is small. For instance, in the transmissivity properties of the color filter 970 having the peak of transmissivity in the green wavelength band, the crosstalk (mixed color) on the long wavelength side in the visible region may not be removed to the demanded level (e.g., same level as pigment filter), as illustrated in FIG. 10B.

Figure 2B:
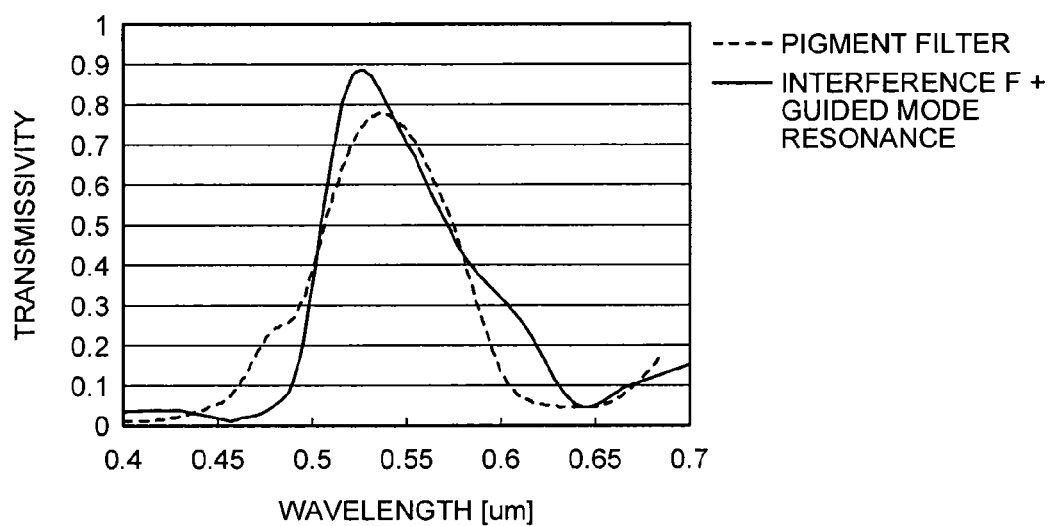

In the embodiment, on the other hand, the air gap structure is formed in a space between the gratings of the guided mode resonant grating in the filter including the interference filter and the guided mode resonant grating serving as the color filter for image sensors. In other words, in the solid-state imaging device 1, each of the plurality of inter-grating regions 64-1 to 64-5 arranged between the plurality of diffraction gratings 61-1 to 61-6 includes the air gap regions 63-1 to 63-5 in addition to the insulating film regions 62-1 to 62-5 in the guided mode resonant grating 960 of the color filter 70. The relative index of refraction of the guided mode resonant grating thus can be enhanced. In other words, the difference between the index of refraction of the diffraction gratings 61-1 to 61-6 and the average index of refraction of the inter-grating regions 64-1 to 64-5 can be made large, so that the specification in which the removal performance of the mixed color component by the guided mode resonant grating 60 is demanded can be easily met. For instance, in the transmissivity properties of the color filter 70 having the peak of transmissivity in the green wavelength band, the crosstalk (mixed color) on the long wavelength side in the visible region can be removed to the demanded level (e.g., same level as pigment filter), as illustrated in FIG. 2B. In other words, according to the embodiment, the crosstalk (mixed color) of the color filter can be improved.

Consider a case where the material of the diffraction gratings 961-1 to 961-6 is changed to the material of high index of refraction to have greater difference between the index of refraction of the diffraction gratings 961-1 to 961-6 and the index of refraction of the inter-grating regions 964-1 to 964-5 in the configuration illustrated in FIG. 10A. In this case, it becomes difficult for the guided mode resonant grating 960 to satisfy the resonance condition, and the transmissivity properties (peak value of transmissivity) of such light tend to degrade.

In the embodiment, on the other hand, the difference between the index of refraction of the diffraction gratings 61-1 to 61-6 and the average index of refraction of the inter-grating regions 64-1 to 64-5 can be made large without changing the material of the diffraction gratings 61-1 to 61-6, so that the degradation of the transmissivity properties (peak value of transmissivity) of the guided mode resonant grating 60 can be suppressed. In other words, according to the embodiment, the crosstalk (mixed color) of the color filter can be improved while suppressing the degradation of the filter property of the color filter.

In the embodiment, the proportion of the volume V1 of the air gap regions 63-1 to 63-5 occupying the volume V2 of the inter-grating regions 64-1 to 64-5 is greater than or equal to 50% and smaller than or equal to 90%. The specification in which the removal performance of the mixed color component by the guided mode resonant grating 60 is demanded thus can be met, and the structure of the guided mode resonant grating 60 illustrated in FIG. 2A can be easily manufactured.

Furthermore, in the embodiment, the proportion of the volume of the air gap region occupying the volume of the inter-grating region is reduced (within the range of greater than or equal to 50% and smaller than or equal to 90%) the more the transparent wavelength region is on the long wavelength side, and the proportion of the volume of the air gap region occupying the volume of the inter-grating region is increased (within the range of greater than or equal to 50% and smaller than or equal to 90%) the more the transparent wavelength region is on the short wavelength side. The removal performance of the mixed color component corresponding to the transparent wavelength region thus can be enhanced for every transparent wavelength region.

In the embodiment described above, the configuration in which the guided mode resonant grating is arranged below the multi-layer interference filter has been illustratively described, but the guided mode resonant grating may be arranged above the multi-layer interference filter. In this case as well, the manner of thinking of the embodiment can be similarly applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a first photoelectric conversion layer; and
   a color filter arranged above the first photoelectric conversion layer; wherein
   the color filter includes,
   a multi-layer interference filter in which a first layer and a second layer having different index of refraction from each other are alternately stacked, and
   a guided mode resonant grating arranged above or below the multi-layer interference filter;
   the guided mode resonant grating includes,
   a plurality of diffraction gratings formed of a material having a first index of refraction and periodically arrayed at least one-dimensionally, and
   a plurality of inter-grating regions arranged between at least the plurality of diffraction gratings; and
   each of the plurality of inter-grating regions includes,
   an insulating film region formed of a material having a second index of refraction lower than the first index of refraction, and
   an air gap region.

2. The solid-state imaging device according to claim 1, wherein
   a proportion of a volume of the air gap region occupying a volume of the inter-grating region is greater than or equal to 50%.

3. The solid-state imaging device according to claim 2, wherein
   the proportion of the volume of the air gap region occupying the volume of the inter-grating region is greater than or equal to 50% and smaller than or equal to 90%.

4. The solid-state imaging device according to claim 1, further comprising:
   a second photoelectric conversion layer; and
   a second color filter arranged above the second photoelectric conversion layer, and being different from the first color filter; wherein
   the second color filter includes,
   a second multi-layer interference filter in which a first layer and a second layer having different index of refraction from each other are alternately stacked, and
   a second guided mode resonant grating arranged above or below the second multi-layer interference filter;
   the second guided mode resonant grating includes,
   a plurality of second diffraction gratings formed of the material having the first index of refraction and periodically arrayed at least one-dimensionally, and
   a plurality of second inter-grating regions arranged between the plurality of second diffraction gratings;
   the plurality of second inter-grating regions each includes, a second insulating film region formed of a material having the second index of refraction lower than the first index of refraction, and a second air gap region; and a proportion of a volume of the second air gap region occupying a volume of the second inter-grating region is different from the proportion of the volume of the air gap region occupying the volume of the inter-grating region.

5. The solid-state imaging device according to claim 4, wherein a transparent wavelength region of the second color filter is on a long wavelength side than a transparent wavelength region of the first color filter; and the proportion of the volume of the second air gap region occupying the volume of the second inter-grating region is smaller than the proportion of the volume of the air gap region occupying the volume of the inter-grating region.

6. The solid-state imaging device according to claim 4, wherein a transparent wavelength region of the second color filter is on a short wavelength side than a transparent wavelength region of the first color filter; and the proportion of the volume of the second air gap region occupying the volume of the second inter-grating region is greater than the proportion of the volume of the air gap region occupying the volume of the inter-grating region.

7. The solid-state imaging device according to claim 1, wherein the air gap region has a substantially triangular shape in cross-sectional view.

8. The solid-state imaging device according to claim 7, wherein the insulating film region covers a side portion and a bottom portion of the air gap region.

9. The solid-state imaging device according to claim 7, wherein an upper end of the inter-grating region is higher than an upper surface of the diffraction grating; and an upper end of the air gap region is higher than the upper surface of the diffraction grating.

10. The solid-state imaging device according to claim 1, wherein the insulating film region has a width in a direction along a surface of a semiconductor substrate gradually widening towards an upper end of the inter-grating region.

11. The solid-state imaging device according to claim 10, wherein the insulating film region has an even film thickness along a bottom portion of the air gap region.

12. The solid-state imaging device according to claim 1, wherein the air gap region has a width in a direction along a surface of a semiconductor substrate gradually narrowing towards an upper end of the inter-grating region.

13. The solid-state imaging device according to claim 1, wherein the plurality of diffraction gratings include a plurality of line patterns; and the plurality of inter-grating regions include a plurality of space patterns.

14. The solid-state imaging device according to claim 13, wherein the insulating film region is arranged on a side wall of the line pattern, and has a substantially fin shape; and the air gap region is arranged between the two substantially fin shapes.

15. The solid-state imaging device according to claim 1, wherein the plurality of inter-grating regions include a plurality of hole patterns; and the plurality of diffraction gratings include a plurality of inter-hole pattern regions.

16. The solid-state imaging device according to claim 15, wherein the insulating film region is arranged on an inner side surface of the hole pattern, and has a substantially cylindrical shape; and the air gap region is arranged on an inner side of the substantially cylindrical shape.

17. The solid-state imaging device according to claim 1, wherein the plurality of diffraction gratings include a plurality of columnar patterns; and the plurality of inter-grating regions include a plurality of inter-columnar pattern regions.

18. The solid-state imaging device according to claim 17, wherein the insulating film region is arranged on a side surface of the columnar pattern, and has a substantially cylindrical shape; and the air gap region is arranged on an inner side of the substantially cylindrical shape.

* * * * *